(12) United States Patent
Hyun

(10) Patent No.: US 7,335,558 B2
(45) Date of Patent: Feb. 26, 2008

(54) METHOD OF MANUFACTURING NAND FLASH MEMORY DEVICE

(75) Inventor: Chan Sun Hyun, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 106 days.

(21) Appl. No.: 11/454,582

(22) Filed: Jun. 16, 2006

(65) Prior Publication Data

US 2007/0122972 A1 May 31, 2007

(30) Foreign Application Priority Data

Nov. 9, 2005 (KR) .................... 10-2005-0107190

(51) Int. Cl.
*H01L 21/336* (2006.01)
(52) U.S. Cl. .............. 438/257; 438/242; 438/238; 438/258; 438/259; 438/260; 438/262; 438/266; 438/267; 438/268; 438/279; 257/E21.614
(58) Field of Classification Search ........... 438/242, 438/260, 262, 267, 279
See application file for complete search history.

(56) References Cited

U.S. PATENT DOCUMENTS 6,337,245 B1 * 1/2002 Choi .................... 438/258

* cited by examiner

*Primary Examiner*—Michael Lebentritt
*Assistant Examiner*—Kyoung Lee
(74) *Attorney, Agent, or Firm*—Marshall, Gerstein & Borun LLP

(57) ABSTRACT

A method of manufacturing a NAND flash memory device, including the steps of providing a semiconductor substrate in which a cell region and a select transistor region are defined; simultaneously forming a plurality of cell gates on the semiconductor substrate of the cell region and forming selection gates on the semiconductor substrate of the select transistor region; forming an oxide film on the entire structure and then forming a nitride film; etching the nitride film so that the nitride film remains only between the selection gates and adjacent edge cell gates; and, blanket etching the oxide film to form spacers on sidewalls of the selection gates. Accordingly, uniform threshold voltage distributions can be secured, and process margins for a spacer etch target can be secured when etching the spacers. Furthermore, the nitride film partially remains between the edge cell gates and the selection gates even after the gate spacers are etched. It is therefore possible to prohibit the infiltration of moisture or hydrogen ion, which may occur in a subsequent process.

6 Claims, 2 Drawing Sheets

METHOD OF MANUFACTURING NAND FLASH MEMORY DEVICE

BACKGROUND

1. Field of the Invention

The invention relates generally to a method of manufacturing a flash memory device and, in particular, to a method of manufacturing a NAND flash memory device, in which when forming spacers on sidewalls of selection gates, damage to a semiconductor substrate between edge cell gates and the selection gates can be prevented.

2. Discussion of Related Art

A NAND flash memory device includes a number of cell blocks. Each of the cell blocks includes a plurality of cell strings, each of which having a plurality of cells for storing data connected in series. A drain selection line and a source selection line are formed between the cell string and the drain, and between the cell string and a common source.

The cell string, the source selection line, and the drain selection line are orthogonal to an isolation film formed to define an active region and a field region, and are spaced apart one another in parallel by a predetermined distance.

Furthermore, the cell includes a cell gate in which a tunnel oxide film, a floating gate, a dielectric layer, and a control gate are stacked, and an impurity region formed on a semiconductor substrate at both sides of the cell gate.

Meanwhile, a select transistor is formed at the intersection of the selection line and the active region. The selection gate of the select transistor may be formed using the same process as the cell gate formation process or may be formed by stripping the dielectric layer in the cell gate formation process.

Cell gates forming one string are formed to have the same width and distance. In the case where two cell gates adjacent to the selection gate (for example, 32 cells) form one string, however, the distance between cell gates connected to a first word line and a last word line (for convenience sake, "edge cell gates") and adjacent cell gates is the same as the distance between other cell gates, but the distance between the cell gates connected to the first word line and the last word line and the selection gate is wider than the distance between other cell gates.

Meanwhile, the distance between the selection gates is wider than that between the cell gates, and is also wider than that between the edge cell gate and the selection gate.

If the distance between the cell gates is narrower than the distance between the selection gates and the distance between the edge cell gate and the selection gate is wider than the distance between the cell gates as described above, the between-the-cell gates are fully buried, but the between-the-edge cell gate and the selection gate are not fully buried when forming an oxide film on the entire structure in order to form spacers on sidewalls of the selection gate.

As a result, in the process of blanket-etching the nitride film to form the spacers on the sidewalls of the selection gate, the semiconductor substrate between the edge cell gate and the selection gate is etched and damaged accordingly.

SUMMARY OF THE INVENTION

In one embodiment, the invention provides a method of manufacturing a NAND flash memory device, in which when forming spacers on sidewalls of selection gates, damage to a semiconductor substrate between edge cell gates and the selection gates can be prevented by selecting the distance between the edge cell gate and the selection gate, which is wider than the distance between center cell gates, but is narrower than the distance between the selection gates.

In another embodiment, the invention provides a method of manufacturing a NAND flash memory device, in which after forming an oxide film for forming spacers on sidewalls of a selection gate, a nitride film is formed on the oxide film between the edge cell gate and the selection gate, whereby a semiconductor substrate between the edge cell gate and the selection gate can be prevented from being damaged when the oxide film is etched in order to form the spacers.

A method of manufacturing a NAND flash memory device according to an embodiment of the invention includes the steps of providing a semiconductor substrate in which a cell region and a select transistor region are defined; simultaneously forming a plurality of cell gates on the semiconductor substrate of the cell region and forming selection gates on the semiconductor substrate of the select transistor region; forming an oxide film on the entire structure and then forming a nitride film; etching the nitride film so that the nitride film remains only between the selection gates and adjacent edge cell gates; and blanket etching the oxide film to form spacers on sidewalls of the selection gates.

A distance between the selection gates, the adjacent edge cell gate and the selection gates may be wider than a distance between the selection gates and non-adjacent center cell gates, but may be narrower than a distance between the selection gates.

Preferably, the oxide film may have the same thickness as that of spacers to be formed on sidewalls of the selection gates.

Preferably the oxide film may be formed to a thickness of about 800 Å to about 1000 Å.

Preferably the nitride film may be formed to a thickness of about 400 Å to about 500 Å, highly preferably using a low plasma method.

Preferably the nitride film may be etched using phosphoric acid ($H_3PO_4$) based on an etch target of about 700 Å to about 1000 Å.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

FIGS. 1A to 1D are cross-sectional views illustrating a method of manufacturing a NAND flash memory device according to an embodiment of the invention.

Figure 1A:
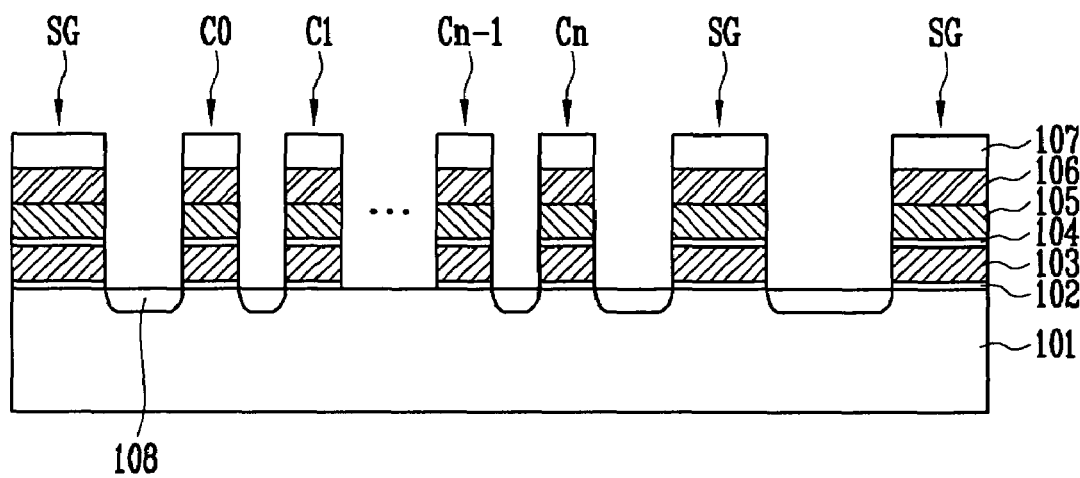
FIGS. 1A to 1D are cross-sectional views illustrating a method of manufacturing a NAND flash memory device according to an embodiment of the invention.

Referring to FIG. 1A, a tunnel oxide film 102, a first polysilicon layer 103, a dielectric layer 104, a second polysilicon layer 105, a tungsten film 106, and a hard mask film 107 are sequentially laminated on a region of a semiconductor substrate 101 in which a cell region, a select transistor region, and so on are defined through suitable processes, such as an isolation film formation process and a well formation process, for example. The dielectric layer 104 of the select transistor region is partially etched so that the first polysilicon layer 103 and the second polysilicon layer 105 are interconnected.

Accordingly, a plurality of cell gates C0, ..., Cn in which a floating gate and a control gate are laminated is formed in the cell region, forming a cell string. At the same time, selection gates SG are formed in the select transistor region.

Meanwhile, the center cell gates C1, ..., Cn-1 of the cells gates forming the cell string are formed to have the same width and distance. The distance between the edge cell gate C0 adjacent to the selection gate SG and the adjacent cell gate C1 and the distance between the edge cell gate Cn adjacent to the selection gate SG and the adjacent cell gate Cn-1 are the same as the distance between other center cell gates, but the distance between the edge cell gates C0 and Cn and the selection gates SG is wider than the distance between other cell gates, but is narrower than the distance between the selection gates SG.

An ion implantation process is then performed to form junctions 108 in the semiconductor substrate 101 between the cell gates and in the semiconductor substrate 101 between the selection gates.

Figure 1B:
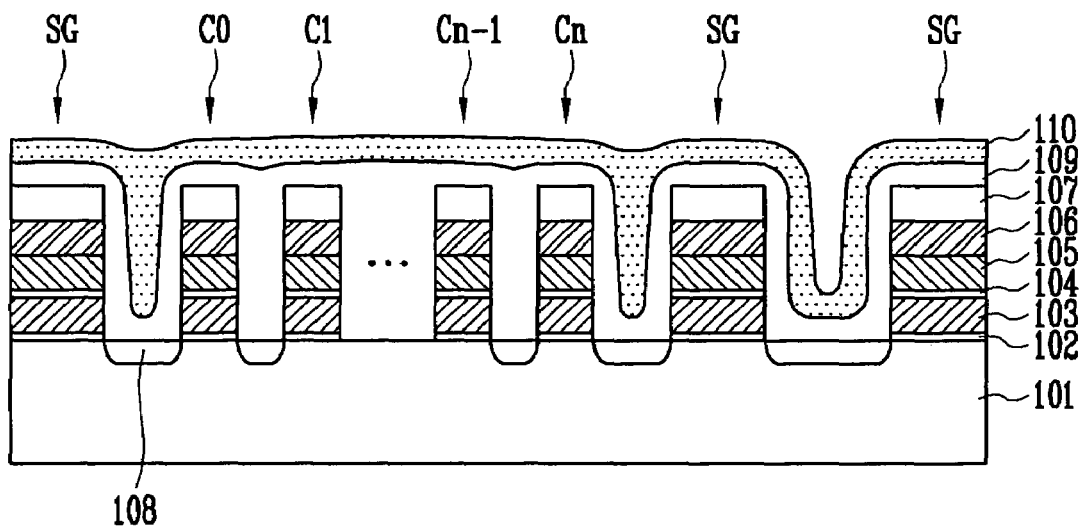

Referring to FIG. 1B, an oxide film 109 for forming spacers on the sidewalls of the selection gates SG is formed on the entire structure. The oxide film 109 may be formed to have the same thickness as that of the spacers to be formed on the sidewalls of the selection gates SG. The oxide film 109 may be formed to a thickness of about 800 Å to about 1000 Å.

The distance between the edge cell gates C0 and Cn and the selection gates SG is narrower than the distance between the selection gates SG, but is wider than the distance between the center cell gates C1, ..., Cn-1. Accordingly, the oxide film 109 is completely buried between the center cell gates C1, ..., Cn-1, but is not completely buried between the edge cell gates C0 and Cn and the selection gates SG.

If a blanket etch process is performed in order to form the spacers in this state, the semiconductor substrate between the edge cell gates and the selection gates is damaged. In an embodiment of the invention, however, a nitride film 110 having an etch selectivity different from that of the oxide film 109 is formed on the entire structure in order to prevent the problem.

The nitride film 110 may preferably be formed to a thickness of about 400 Å to about 500 Å using a low plasma method with a good step coverage characteristic.

Figure 1C:
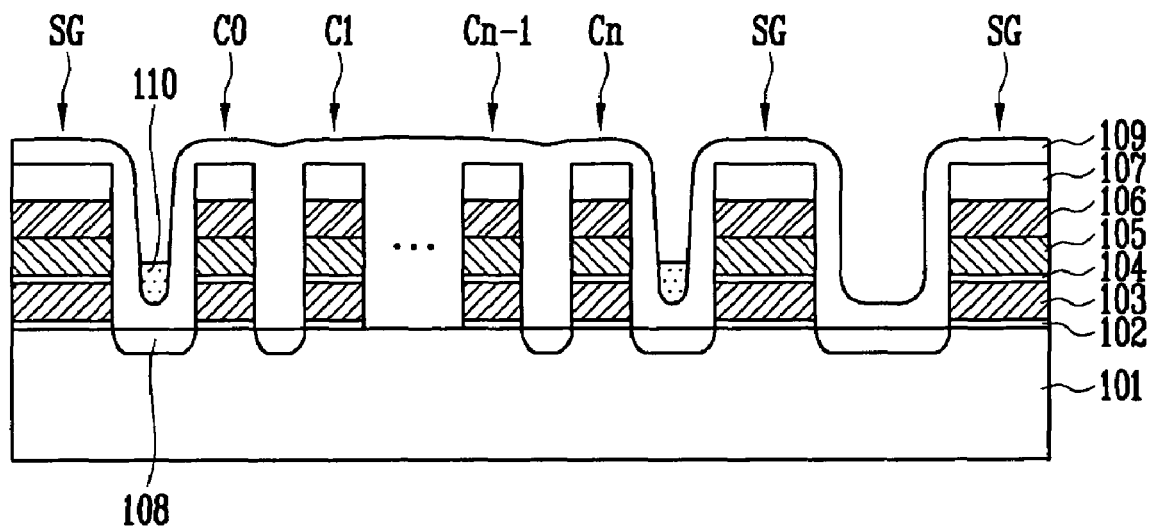

Referring to FIG. 1C, the nitride film 110 is etched perferably using a wet etch process employing phosphoric acid ($H_3PO_4$), so that the nitride film 110 remains only between the edge cell gates C0 and Cn and the selection gates SG. At this time, the wet etch process may be performed based on a process time in which the nitride film 110 is all stripped from other regions, but the nitride film 110 between the edge cell gates C0 and Cn and the selection gates SG is not all stripped by properly controlling a process time of the wet etch process employing phosphoric acid ($H_3PO_4$) (for example, a target in which the nitride film 110 of about 700 Å to about 1000 Å is stripped).

Figure 1D:
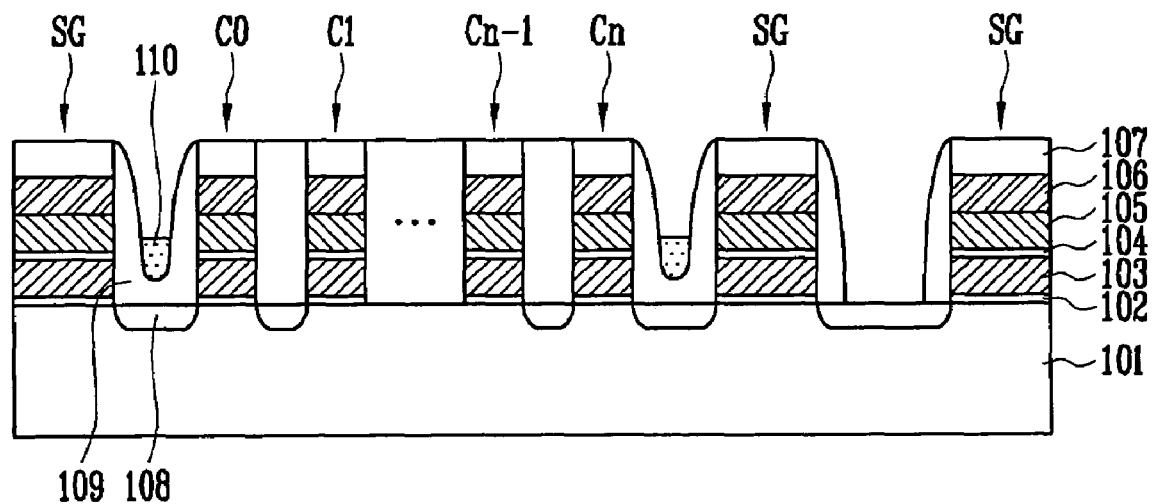

Referring to FIG. 1D, the oxide film 109 is blanket etched to form spacers on the sidewalls of the selection gates SG. While the oxide film 109 is etched, the nitride film 110 is partially etched. Furthermore, since the nitride film 110 exists between the edge cell gates C0 and Cn and the selection gates SG, the semiconductor substrate 101 between the edge cell gates C0 and Cn and the selection gates SG is not damaged although the etch process is performed using a sufficient target.

As described above, according to the invention, when forming the spacers on the sidewalls of the selection gates, damage to the semiconductor substrate between the edge cell gates and the selection gates can be prevented by the distance between the edge cell gates and the selection gates, which is wider than the distance between center cell gates, but is narrower than the distance between the selection gates. Accordingly, uniform threshold voltage distributions can be secured, and process margin for a spacer etch target can be secured when etching the spacers.

Furthermore, the nitride film partially remains between the edge cell gates and the selection gates even after the gate spacers are etched. It is therefore possible to prohibit the infiltration of moisture or hydrogen ion, which may occur in a subsequent process.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of manufacturing a NAND flash memory device, the method comprising the steps of:
   providing a semiconductor substrate in which a cell region and a select transistor region are defined;
   simultaneously forming a plurality of cell gates on the semiconductor substrate of the cell region and forming selection gates on the semiconductor substrate of the select transistor region;
   forming an oxide film on the entire structure and then forming a nitride film;
   etching the nitride film so that the nitride film remains only between the selection gates and adjacent edge cell gates; and,
   blanket etching the oxide film to form spacers on sidewalls of the selection gates.

2. The method of claim 1, wherein a distance between the selection gates, the adjacent edge cell gate, and the selection gates is wider than a distance between the selection gates and non-adjacent center cell gates, but is narrower than a distance between the selection gates.

3. The method of claim 1, wherein the oxide film has the same thickness as that of spacers to be formed on sidewalls of the selection gates.

4. The method of claim 1, comprising forming the oxide film to a thickness of about 800 Å to about 1000 Å.

5. The method of claim 1, comprising forming the nitride film to a thickness of about 400 Å to about 500 Å using a low plasma method.

6. The method of claim 1, comprising etching the nitride film using phosphoric acid ($H_3PO_4$) based on an etch target of about 700 Å to about 1000 Å.

* * * * *